United States Patent
Zaharchuk et al.

(10) Patent No.: US 7,064,545 B2
(45) Date of Patent: Jun. 20, 2006

(54) METHOD AND APPARATUS OF BACKGROUND SUPPRESSION IN MR IMAGING USING SPIN LOCKING

(75) Inventors: Gregory G. Zaharchuk, San Francisco, CA (US); Jean H. Brittain, Menlo Park, CA (US)

(73) Assignees: General Electric Company, Schenectady, NY (US); The Regents of the University of California, Oakland, CA (US)

( * ) Notice: Subject to any disclaimer, the term of this patent is extended or adjusted under 35 U.S.C. 154(b) by 43 days.

(21) Appl. No.: 10/711,169

(22) Filed: Aug. 30, 2004

(65) Prior Publication Data

US 2006/0043970 A1    Mar. 2, 2006

(51) Int. Cl.
    *G01V 3/00* (2006.01)
(52) U.S. Cl. .................................. 324/307; 324/309
(58) Field of Classification Search ............... 324/306, 324/309, 307, 318, 319, 322, 300; 600/410
    See application file for complete search history.

(56) References Cited

U.S. PATENT DOCUMENTS

| | | | |
|---|---|---|---|
| 5,192,909 A * | 3/1993 | Hardy et al. ............... 324/309 |
| 5,256,967 A * | 10/1993 | Foo et al. ................... 324/311 |
| 5,345,174 A | 9/1994 | Kimmich et al. | |
| 5,619,139 A | 4/1997 | Holczer et al. | |
| 6,094,591 A * | 7/2000 | Foltz et al. ................. 600/419 |
| 6,275,040 B1 * | 8/2001 | Zur ............................ 324/320 |
| 6,377,831 B1 | 4/2002 | Seshan et al. | |
| 6,380,739 B1 * | 4/2002 | Machida ..................... 324/309 |
| 6,498,946 B1 * | 12/2002 | Foo et al. ................... 600/410 |
| 6,501,272 B1 * | 12/2002 | Haacke et al. ............. 324/306 |
| 6,618,605 B1 | 9/2003 | Wolff et al. | |
| 6,903,548 B1 * | 6/2005 | Foo ............................ 324/306 |

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

The present invention is directed to a method and system of tissue or background suppression for the acquisition of image data from blood flow or tissue perfusion. Background suppression with minimal effects upon inflowing spins is achieved through a series of spin locking low level RF pulses that cause adiabatic demagnetization of tissue with a relaxation time T1-rho that is intermediate between T1 and T2 relaxation times. In this regard, the effective transverse magnetization of static tissue resulting from the application of a series of low level RF pulses is reduced and, with the spin locking, longitudinal magnetization regrowth is minimized. As such, inflowing spins to an imaging volume may be directly imaged with significant background tissue suppression. The present invention is particularly applicable to time-of-flight MRA and MR perfusion imaging.

25 Claims, 3 Drawing Sheets

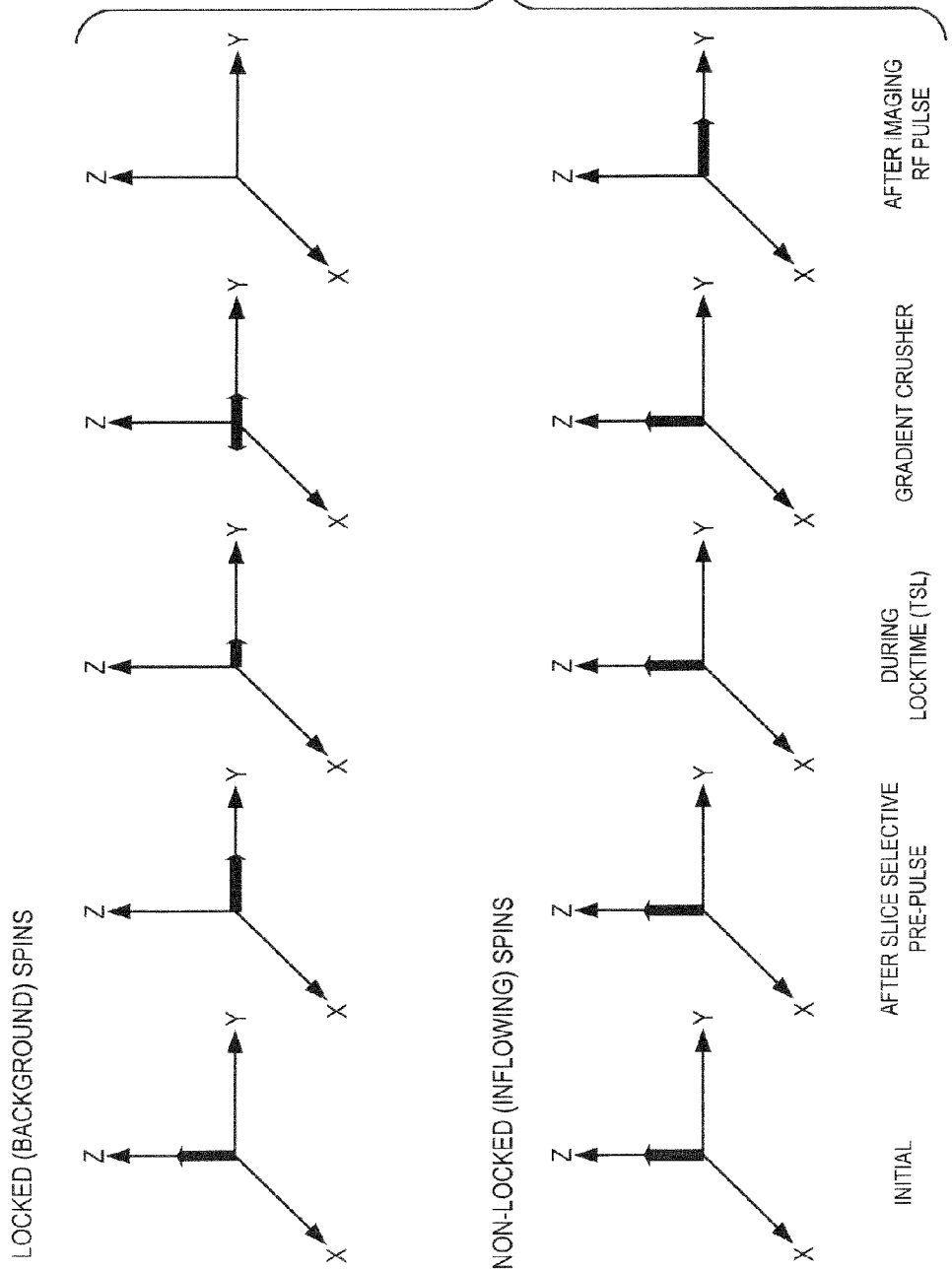

METHOD AND APPARATUS OF BACKGROUND SUPPRESSION IN MR IMAGING USING SPIN LOCKING

BACKGROUND OF THE INVENTION

The present invention relates generally to contrast generation for MR imaging and, more particularly, to a method and apparatus of background suppression particularly useful in angiography and perfusion imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

MR angiography and arterial spin label perfusion are MR imaging techniques that have been shown to be probative in the imaging of the vasculature and hemodynamic state of the brain for evidence of a number of pathologies and diseases including, but not limited to tumors (both pre- and post-operative), vascular malformations, various dementias including Alzheimer's disease, and epilepsy to name just a few. In the imaging of blood perfusion, tissue exogenous and endogenous tracers are commonly used to produce differential contrast. One example of an exogenous tracer or contrast agent is gadolinium-diethylenetriaminepentaacetic acid (GD-DTPA) which, when introduced to a patient, modifies the relaxation of protons in the blood, including producing a shorter T2* relaxation time. Endogenous tracers, on the other hand, depend upon the ability to generate contrast from specific excitation or diffusion mechanisms resident in the patient. For example, in "black blood" perfusion, inflowing spins or protons in the blood are labeled and, as such, function as a contrast agent. The labeled spins outside the imaging volume perfuse into tissue thereby resulting in a drop of signal intensity that can be measured over time to provide quantitative measurements of the time course of events such as time to peak, contrast enhancement ratio, and slope of the first pass contrast enhanced MR images.

Blood oxygen level dependent (BOLD) and "functional MR" imaging are examples of MR perfusion imaging techniques that are used to image the brain. Both of the aforementioned imaging techniques rely on the differential contrast generated by blood metabolism in active areas of the brain. Inflow of blood and the conversion of oxyhemoglobin to deoxyhemoglobin increases the magnetic susceptibility in a localized area as well as induces signal loss by reducing the T2* relaxation time of "tipped" spins. As such, this allows areas of high metabolic activity to produce a correlated signal. Generally, a control or mask image is acquired prior to application of a particular stimulus for passage of the exogenous or endogenous contrast agent through the imaging volume. Following acquisition of a series of MR perfusion images, the mask or control image is subtracted from each of the MR perfusion images after image reconstruction. The resulting images therefore show the differences between pre-stimulated tissue and post-stimulated or perfused tissue.

As one skilled in the art will appreciate, the creation of control or mask images as well as the subtraction of the mask or control images from the MR perfusion images increases overall scan time, decreases patient throughput, and increases the likelihood of patient induced motion artifacts.

MR angiography (MRA) is an imaging technique similar to perfusion imaging in that signal from fluid, i.e., blood or cerebral spinal fluid (CSF), is used as the basis of contrast in a reconstructed image. Time-of-flight (TOF) MRA is an MRA imaging technique that relies on the tagging of blood in one region of the body and detecting in another. As such, when the tagged blood enters a particular imaging volume, the tagged blood will provide contrast differentiation from the surrounding stationary tissues. Generally, tagging of the blood is accomplished by spin saturation, inversion, or relaxation to change the longitudinal magnetization of moving blood. One skilled in the art will appreciate that the penetration of tagged blood into the imaging volume depends on the T1 relaxation time of the blood, its velocity, and direction of flow. Like MR perfusion imaging, the effectiveness of MRA is largely predicated upon the degree of contrast achieved between the stationary or static background tissue and the inflowing fluid. That is, for the reconstructed image to be generally diagnostically valuable for the identification and detection of pathologies, detectable contrast between the inflowing fluid and the background tissue must be present. Heretofore, contrast differentiation has been primarily improved with black blood nulling wherein readout occurs when the relaxation time of blood crosses its null point, mask image subtraction, or through the use of exogenous contrast agents.

Notwithstanding the advancement of black blood nulling, mask image subtraction, and exogenous contrast agents, each of the aforementioned techniques increases scan time and/or depicts inflowing blood or other fluid as a signal void. It would, therefore, be advantageous to design a method and system of MR imaging with background suppression and data acquisition from inflowing fluid with reduced scan time.

BRIEF DESCRIPTION OF THE INVENTION

The present invention is directed to a method and system of tissue or background suppression for the acquisition of image data from blood flow or tissue perfusion that overcomes the aforementioned drawbacks. Background suppression with minimal effects upon inflowing spins is achieved through a series of spin locking, low level RF pulses that cause adiabatic demagnetization of tissue with a relaxation time T1-rho that is intermediate between T1 and T2 relaxation times. In this regard, the effective transverse magnetization of static tissue resulting from the application of the series of low level RF pulses is reduced and, with the spin locking, longitudinal magnetization regrowth is minimized. As such, inflowing spins to an imaging volume may be directly imaged with significant background tissue suppression. The present invention is particularly applicable to TOF MRA and MR perfusion imaging.

Therefore, in accordance with one aspect of the present invention, a pulse sequence to suppress background tissue includes a slice selective pulse to spatially select an ROI for spin suppression as well as a number of non-selective RF pulses played out after the slice selective pulse to suppress magnetization of static spins within the ROI. The pulse sequence further includes an imaging pulse played out after a number of non-selective RF pulses to excite inflowing spins to the ROI.

In accordance with another aspect of the present invention, a method of MR flow imaging includes the steps of selecting an ROI in which flow therein will be imaged and apply a train of low energy RF pulses to suppress magnetization of spins in the ROI. The method further includes the step of exciting longitudinal magnetization of inflowing spins in the ROI and the step of acquiring MR data from the inflowing spins.

In accordance with another aspect of the invention, an MRI apparatus includes an MRI system having a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to apply a pulse sequence having a slice selective pulse to induce transverse magnetization in spins of a predefined static volume and a series of non-selective pulses to suppress the transverse magnetization of the spins in the predefined static volume. The pulse sequence is further defined as having an excitation pulse to induce transverse magnetization in inflowing spins to the predefined static volume.

In accordance with another aspect of the invention, the invention is embodied in a computer program stored on a computer readable storage medium and having instructions which, when executed by a computer, cause the computer to apply a slice selective RF pulse and gradient to spatially define a volume for background suppression and apply a train of non-selective RF pulses to lock spins in the volume. The computer is also caused to apply another slice selective RF pulse to excite longitudinal magnetization of inflowing spins to the volume.

Various other features, objects, and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 3 is a graphical representation of a series of x-y-z Cartesian grids illustrating behavior of locked and unlocked spins during application of the pulse sequence shown in FIG. 2.

DETAILED DESCRIPTION OF THE PREFERRED EMBODIMENT

Figure 1:
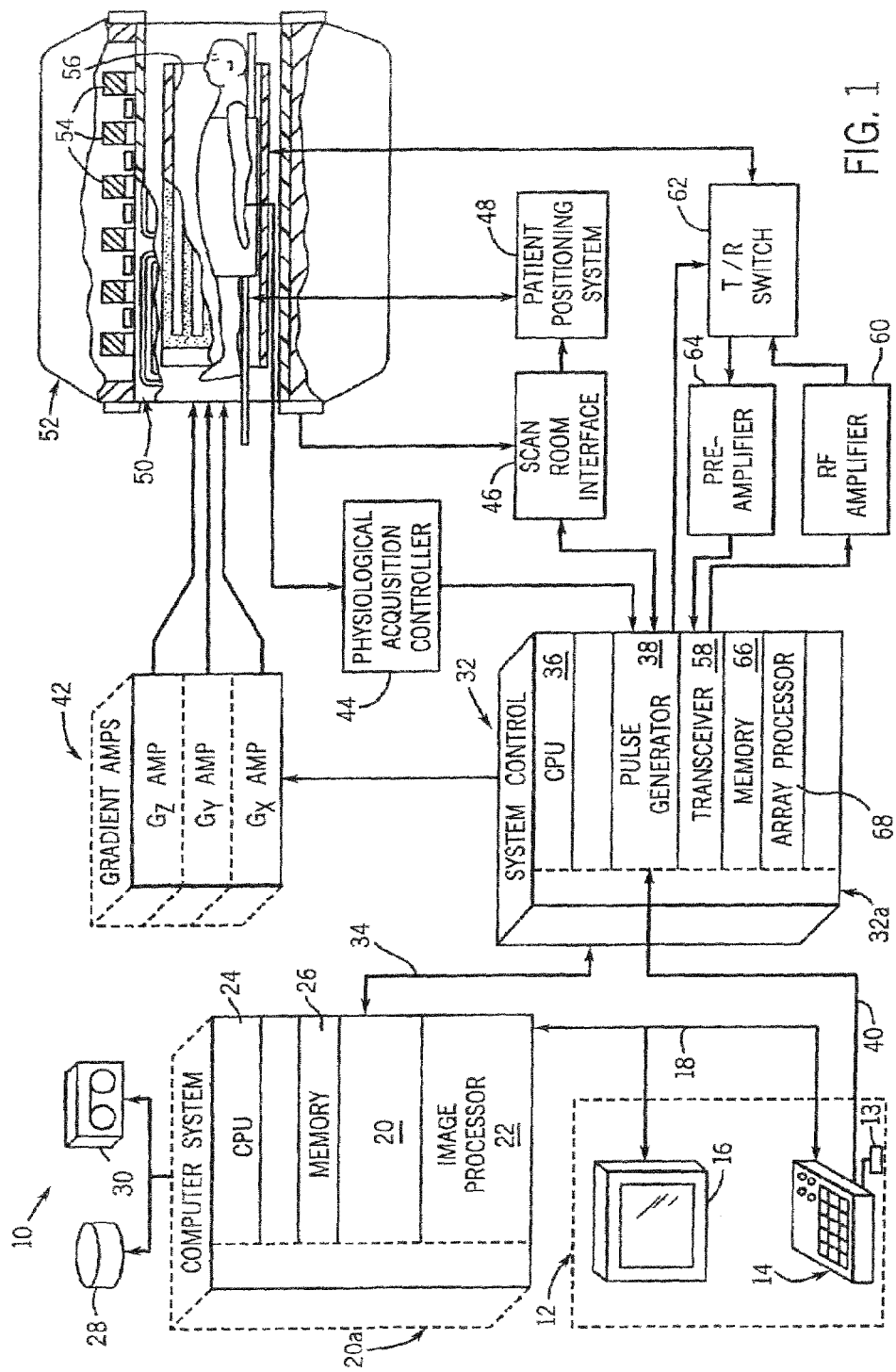
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention includes a method and system suitable for use with the above-referenced MR system, or any similar or equivalent system for acquiring MR images.

Figure 2:
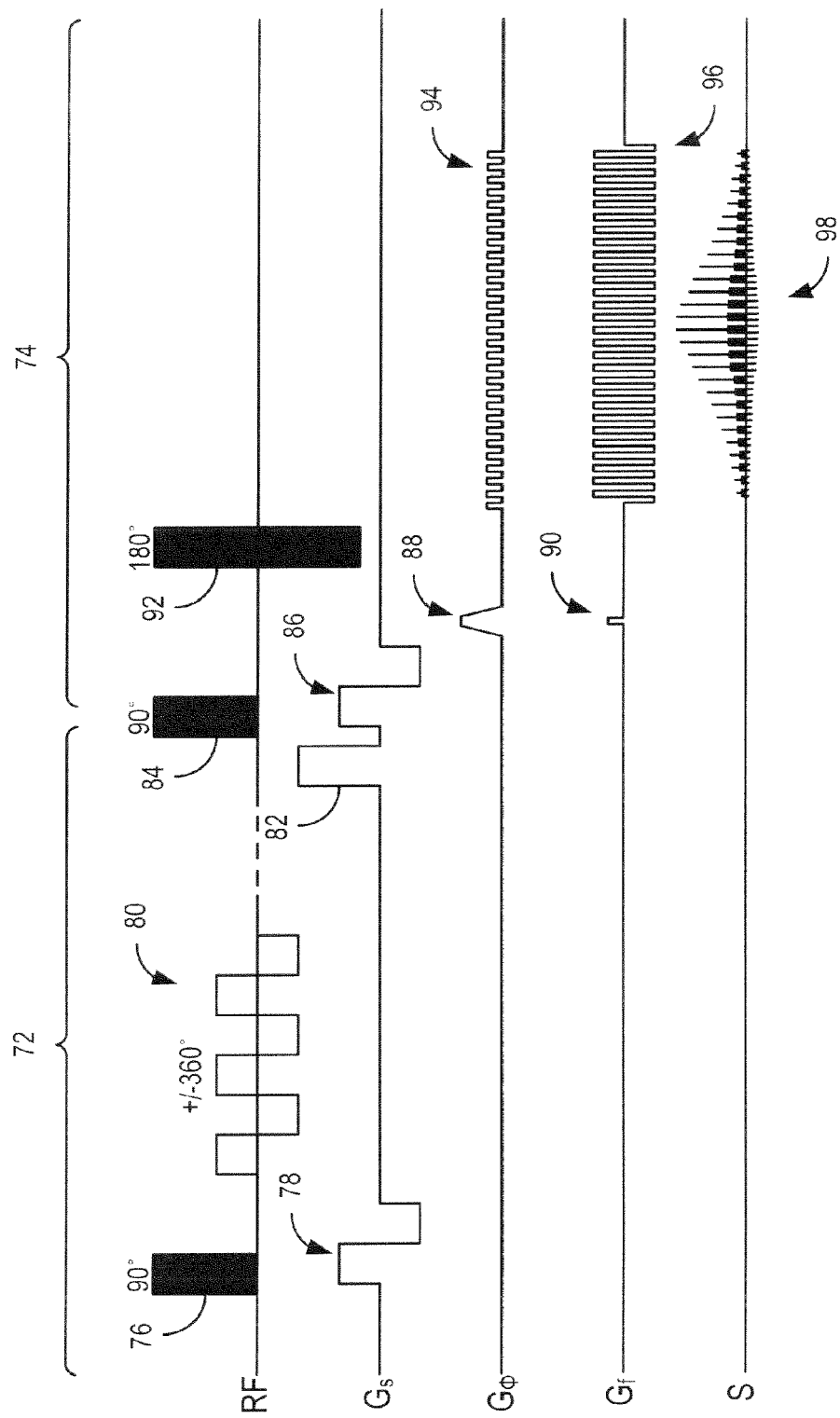
FIG. 2 is a graphical representation of a pulse sequence diagram with spin locking and EPI readout.

Referring now to FIG. 2, a pulse/acquisition sequence is shown such as that disclosed with reference to FIG. 1 that is used by and generated for an MR system according to the present invention. As indicated, the pulse sequence 70 is defined by a preparatory module 72 and an imaging module 74. As will be described, data acquisition or imaging occurs with EPI readout, but it is contemplated that many other data acquisition techniques may be used, such as spiral readout as just one example. The preparatory module 72 of pulse sequence 70 is defined by a slice selective RF pulse 76 that, in conjunction with slice encoding gradient 78, is used to spatially define a region for background suppression. The slice selective RF pulse 76 can be referred to as a pre-pulse, or preparatory pulse. As will be described, the background is preferably suppressed to enhance contrast between it and inflowing fluid to the region. In a preferred embodiment, the slice selective pre-pulse 76 has a flip angle of 90 degrees. Following application of slice selective pulse 76 and slice encoding gradient 78, a train or series of non-selective RF pulse pairs 80 is played out. Each pulse pair is defined by a positive going RF pulse and a negative going RF pulse with flip angles of +360 degrees and −360 degrees, respectively, with a 90° phase offset from pulse 76 to achieve spin locking. Other composite pulse combinations could also be utilized. In addition, the magnitude of each non-selective RF pulse has a strength of B1-rho which is sufficient to "lock" the spins within the selected region. In this regard, the duration of the spin locking RF pulses is matched to the T1-rho relaxation time of the background tissue spins. Accordingly, this adiabatic demagnetization in the rotating frame is sufficient to prevent longitudinal magnetization of the locked spins.

The locked spins decay at the time constant T1-rho which, as referenced above, is between their respective T1 and T2 relaxation times. It is generally well known that for most tissues, T1-rho is significantly shorter than T1. For example, gray and white matter T1-rho is on the order of 100 to 200 ms whereas the T1 time of gray and white matter is on the order of 600–1200 ms. As such, for spin locking times on the order of several T1-rho, the effective transverse magnetization of the static background tissue is reduced. Additionally, while the spins are locked, no regrowth of the longitudinal magnetization occurs and spins outside the selected region or predefined volume undergo on-resonance magnetization transfer and direct saturation effects.

Still referring to FIG. 2, after application of the non-selective low energy RF pulses 80, collectively which have a spin lock pulse duration of TSL, a crusher gradient 82 is applied to dephase residual transverse magnetization of spins within the selected region. Immediately after application of the crusher gradient, a slice selective RF pulse 84, having a preferred flip angle of 90 degrees, is applied to excite the longitudinal magnetization within the selective region. The excited longitudinal magnetization should be primarily due to inflowing unlocked spins in the predefined volume.

As referenced above, a number of data acquisition techniques may be implemented to acquire MR data from the inflowing spins with background suppression. For example, echo planar readout (EPI) is one contemplated means of acquiring MR signals from the inflowing spins. In this regard, the imaging module 74 of pulse sequence 70 illustrates a conventional EPI acquisition sequence or acquisition. After application of the slice selective RF pulse 84 which is applied in conjunction with slice selection or slice selective encoding gradient 86, an initial phase encoding gradient pulse 88 and an initial frequency encoding gradient pulse 90 are applied to position the spins at the corner of k-space. Thereafter, a 180 degree RF pulse 92 is applied for this spin-echo implementation. A gradient echo acquisition could also be used. The phase and frequency encoding directions are then cycled so as to traverse k-space. In this regard, a number of phase and frequency encoding gradients are applied when the echo is recorded. As shown, a series of phase encoding gradients 94 are applied contemporaneously with a train of frequency encoding gradients to record the MR signal 98 to fill k-space.

As referenced above, the time in which it takes to apply the series of non-selective low energy RF pulses defines a spin lock pulse duration. In this regard, for shorter TSL, the present invention provides angiographic contrast while for longer TSL, tissue perfusion is preferably imaged. Whether implemented for MR angiography, MR perfusion imaging, or some other application, the present invention provides reduced magnetization of static spins within a predefined volume while the spins outside this predefined volume are minimally perturbed.

Referring now to FIG. 3, a graphical display of the behavior of locked spins and non-locked spins is shown. As illustrated, initially the magnetization of the background spins and the inflowing spins extends along a common longitudinal axis, which in the illustrated example is designated as the z-axis. Following application of the slice selective RF pulse to select a region for background suppression, the background spins are "tipped" to the transverse plane whereas the inflowing spins remain in the longitudinal plane. The transverse magnetization of the tipped background spins begins to decay after application of the slice selective RF pulse. As such, in accordance with the present invention, shortly after application of the slice selective RF pulse, a train of low level RF spin locking pulses is applied. As a result of the repeated application of the non-selective RF pulse pairs having respective positive and negative 360 degree flip angles, the transverse magnetization of the background spins is locked in the transverse plane. As such, these spins are prevented from decaying to the initial longitudinal plane. To dephase any residual transverse magnetization of the background or locked spins in the transverse plane, a gradient crusher pulse is applied. As such, after the gradient crusher is applied, the transverse magnetization of the background spins is preferably eliminated, if not minimized, whereupon an imaging pulse with a 90 degree flip angle "tips" the longitudinal magnetization of the inflowing spins to the transverse plane or y-axis. This transverse magnetization may then be used with an EPI readout to acquire MR signals only from the inflowing spins. Since data acquisition is limited to the inflowing spins, substantial contrast results in the reconstructive image of the predefined volume.

The present invention was demonstrated using brain imaging testing carried out with a 1.5-T GE Signa® LX scanner with the following parameters: TR of 3.0 s/TE (16 ms EPI, 2.2 ms spiral)/TSL of 100 to 400 ms/B1-rho of 5 to 100 mG. SIGNA is a registered trademark of General Electric Co., Fairfield, Conn. The TSL was limited to a maximum of 400 ms by amplifier duty cycle restrictions. A 3.2 ms slice selective sinc pulse was used as the pre-pulse. The pulse widths of the ±360 degree spin locking pulses were adjusted based on B1-rho. A gradient for an initial 4 cm slice selective 90 degree pulse was placed in the x-direction to allow visualization of the locked and non-locked regions on the same image. Images acquired with the aforementioned scan parameters were compared to images acquired without application of spin locking pulses. Images that were acquired without spin lock pulses showed normal saturation recovery. Those images acquired with spin locking pulses showed background suppression to be approximately that of the scanner noise level for all TSL. No significant change in locking efficiency existed for B1-rho between 20–100 mG. A slight increase in background signal was noted at 10 mG in the region overlying the frontal sinuses where $B_0$ is known to be inhomogeneous. From testing, it is believed that this may reflect the lower limit of locking $B_1$ power. Non-locked spins showed decreased but spatially uniform signal intensity with an appearance suggesting magnetization transfer effects. In the non-locked region, for a TSL of 400 ms, CSF signal was reduced by approximately 50 percent while the brain parenchymal signal was reduced by about 86 percent.

One skilled in the art will appreciate that spin locking with low energy level B1 fields in accordance with the present invention may be used to demagnetize a predefined ROI thereby suppressing background tissue to approximately the scanner's noise level. From testing, it is believed that three factors contribute to this suppression: (1) the relatively short T1-rho of brain tissue (100–200 msec), (2) the crusher gradient which removes residual locked signal, and (3) the second 90 degree RF pulse which flips any residual signal out of the transverse plane. The locking signals are lower than those used in continuous arterial spin label perfusion imaging and therefore provide an alternative for perfusion measurements at high fields with acceptable SAR. In addition, the composite ±360 degree locking pulses are effective in maintaining a uniform magnetization outside the locked region. This composite spin lock pulse series has the added advantage of B1 insensitivity. It is also noted that on-resonance magnetization transfer effects, which are normally small in blood, are at least partially responsible for the decrease in the equilibrium magnetization of these spins. Direct saturation, i.e., due to T2 signal loss during the 360 degree spin locking pulses, may also play a role in this process.

Accordingly, the present invention also includes a method of MR flow imaging that includes selecting an ROI in which flow therein will be imaged. The method is further defined by applying a train of low energy RF pulses to suppress magnetization of spins in the selected ROI as well as exciting longitudinal magnetization of inflowing spins in the ROI. The method further includes the step of acquiring MR data from inflowing spins. A crusher gradient is applied to reduce residual transverse magnetization of spins in the ROI prior to excitation of the longitudinal magnetization of the inflowing spins. One skilled in the art will appreciate that the present invention is applicable with a number of data acquisition protocols including EPI readout and spiral readout.

The present invention also includes a computer readable storage medium having a computer program stored thereon and representing a set of instructions that when executed by a computer causes the computer to apply a slice selective RF pulse gradient to spatially define a volume for background suppression. The computer is also caused to apply a train of non-selective RF pulses to lock spins in the volume and apply another slice selective RF pulse to excite longitudinal magnetization of inflowing spins to the volume.

The present invention also includes an MR apparatus to acquire angiographic or perfusion image data with background suppression. The MR apparatus includes a magnetic resonance imaging system having a number of gradient coils positioned about a bore of a magnet to impress a polarizing magnetic field and an RF transceiver system and RF switch controlled by a pulse module to transmit RF signals to an RF coil assembly to acquire MR images. The MR apparatus also includes a computer program to apply the pulse sequence having a slice selective pulse to induce transverse magnetization in spins of a predefined static volume. The pulse sequence is also defined as having a series of non-selective pulses to suppress the transverse magnetization of the spins of the predefined static volume as well as an excitation pulse to induce transverse magnetization in inflowing spins to the predefined static volume.

The present invention has been described in terms of the preferred embodiment, and it is recognized that equivalents, alternatives, and modifications, aside from those expressly stated, are possible and within the scope of the appending claims.

What is claimed is:

1. An MR apparatus to acquire angiographic or perfusion image data with background suppression, the MR apparatus comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to apply a pulse sequence having:

a slice selective pulse to induce transverse magnetization in spins of a predefined static volume;

a series of non-selective pulses to suppress the transverse magnetization of the spins of the pre-defined static volume; and an excitation pulse to induce transverse magnetization in inflowing spins to the predefined static volume.

2. The MR apparatus of claim 1 wherein the non-selective pulses are further defined to have an energy level less than that of the slice selective pulse.

3. The MR apparatus of claim 1 wherein the pulse sequence further has a crusher gradient pulse to reduce residual transverse magnetization of the spins of the pre-defined static volume before application of the excitation pulse.

4. The MR apparatus of claim 1 wherein the excitation pulse has a 90 degree flip angle.

5. The MR apparatus of claim 1 wherein the pulse sequence is further defined by a series of imaging pulses with echo planar readout.

6. The MR apparatus of claim 1 wherein the pulse sequence is further defined by a series of imaging pulses with spiral readout.

7. The MR apparatus of claim 1 wherein the series of non-selective RF pulses includes pulse pairs.

8. The MR apparatus of claim 7 wherein the pulse pairs includes a first non-selective pulse and a second non-selective pulse, and wherein the first non-selective pulse has a flip angle of +360 and the second non-selective pulse has a flip angle of −360 degrees.

9. A method of MR flow imaging comprising the steps of:
selecting an ROI in which flow therein will be imaged;
applying a train of low energy RF pulses to suppress magnetization of spins in the ROI;
exciting longitudinal magnetization of inflowing spins in the ROI; and
acquiring MR data from the inflowing spins.

10. The method of claim 9 further comprising the step of applying a crusher gradient to reduce residual transverse magnetization of spins in the ROI prior to the step of exciting.

11. The method of claim 9 wherein the step of acquiring includes one of:
EPI readout; and
spiral readout.

12. The method of claim 9 wherein the step of selecting includes the step of applying a slice select gradient pulse and a slice select encoding RF pulse having a flip angle of 90 degrees.

13. The method of claim 9 wherein the step of applying includes the step of playing out a number of RF pulse pairs, one RF pulse of the pair having a +360 degree flip angle and the other RF pulse of the pair having a −360 degree flip angle.

14. The method of claim 13 further comprising the step of determining the number of RF pulse pairs based on whether an angiographic image acquisition or a perfusion image acquisition is to be carried out.

15. A pulse sequence to suppress background tissue, the pulse sequence comprising:
a slice selective pulse to spatially select an ROI for spin suppression;
a number of non-selective RF pulses played out after the slice selective pulse to suppress magnetization of static spins within the ROI; and
an imaging pulse played out after the number of non-selective RF pulses to excite inflowing spins to the ROI.

16. The pulse sequence of claim 15 wherein each of the number of non-selective RF pulses has an energy level less than that of the slice selective pulse and the imaging pulse.

17. The pulse sequence of claim 15 further comprising a crusher gradient pulse played out before the imaging pulse to de-phase residual transverse magnetization of spins outside the ROI.

18. The pulse sequence of claim 17 wherein the crusher gradient pulse dephases residual transverse magnetization at a slice orientation aligned with the spatially selected ROI.

19. The pulse sequence of claim 15 wherein the slice selective pulse has a flip angle of 90 degrees and the imaging pulse has a flip angle of 90 degrees.

20. The pulse sequence of claim 15 wherein the number of non-selective RF pulses includes pulse pairs.

21. The pulse sequence of claim 20 wherein the pulse pairs are applied along a plane of orientation transverse to the slice selective pulse.

22. The pulse sequence of claim 20 wherein the pulse pairs include a first non-selective pulse and a second non-selective pulse, and wherein the first non-selective pulse has a flip angle of +360 degrees and the second non-selective pulse has a flip angle of −360 degrees.

23. The pulse sequence of claim 15 wherein the number of non-selective RF pulses defines a spin lock pulse duration (TSL), and for angiographic contrast the TSL is shorter than that for perfusion imaging.

24. A computer readable storage medium having a computer program stored thereon and representing a set of instructions that when executed by a computer causes the computer to:
apply a slice selective RF pulse and gradient to spatially define a volume for background suppression;
apply a train of non-selective RF pulses to lock spins in the volume; and
apply another slice selective RF pulse to excite longitudinal magnetization of inflowing spins to the volume.

25. The computer readable storage medium of claim 24 wherein the computer is further caused to apply an RF excitation pulse with echo planar or spiral readout.

* * * * *

UNITED STATES PATENT AND TRADEMARK OFFICE
CERTIFICATE OF CORRECTION

| | |
|---|---|
| PATENT NO. | : 7,064,545 B2 |
| APPLICATION NO. | : 10/711169 |
| DATED | : June 20, 2006 |
| INVENTOR(S) | : Zaharchuk et al. |

It is certified that error appears in the above-identified patent and that said Letters Patent is hereby corrected as shown below:

Col. 9, line 9 (Claim 8), delete "+360" and substitute therefor -- +360 degrees --.

Signed and Sealed this

Twelfth Day of September, 2006

JON W. DUDAS
*Director of the United States Patent and Trademark Office*